United States Patent [19]

Rush

[11] Patent Number: 4,743,839
[45] Date of Patent: May 10, 1988

[54] WIDE BANDWIDTH PROBE USING POLE-ZERO CANCELLATION

[75] Inventor: Kenneth Rush, Colorado Springs, Colo.

[73] Assignee: Hewlett Packard Company, Palo Alto, Calif.

[21] Appl. No.: 945,202

[22] Filed: Dec. 19, 1986

Related U.S. Application Data

[63] Continuation of Ser. No. 648,901, Sep. 7, 1984, abandoned.

[51] Int. Cl.$^4$ .............................................. G01R 31/02
[52] U.S. Cl. ................................ 324/72.5; 324/121 R
[58] Field of Search ............ 324/58 A, 58.5 A, 58.5 B, 324/65 P, 158 P, 72.5, 78 R, 78 F, 78 N, 121 R; 367/13

[56] References Cited

U.S. PATENT DOCUMENTS

| | | | |
|---|---|---|---|
| 2,881,400 | 4/1959 | Rogers | 324/149 |
| 3,015,080 | 12/1961 | Santelmann, Jr. et al. | 324/72.5 |
| 3,906,344 | 9/1975 | Addis et al. | 324/121 R |
| 4,260,951 | 4/1981 | Lewyn | 328/165 |
| 4,486,862 | 12/1984 | Wyber | 367/13 |

OTHER PUBLICATIONS

Finch et al., "Miniature Oscilloscope Probes for Measurements in Crowded Circuits", Apr., 1977, pp. 9–12, Hewlett-Packard J.

Primary Examiner—Michael J. Tokar
Attorney, Agent, or Firm—Karl E. Bring; Jon R. Stark

[57] ABSTRACT

A probe apparatus for use with analyzing devices, primarily oscilloscopes, which uses pole-zero cancellation to provide a probe with low capacitance and wide bandwidth. Pole-zero cancellation enables the probe to have constant gain at all frequencies. In one embodiment, the coaxial cable between the probe tip and the replication amplifier is terminated in its characteristic impedance to provide constant gain at all frequencies regardless of cable length. Use of pole-zero cancellation and thick film technology enables building a probe with a small, durable tip.

12 Claims, 10 Drawing Sheets

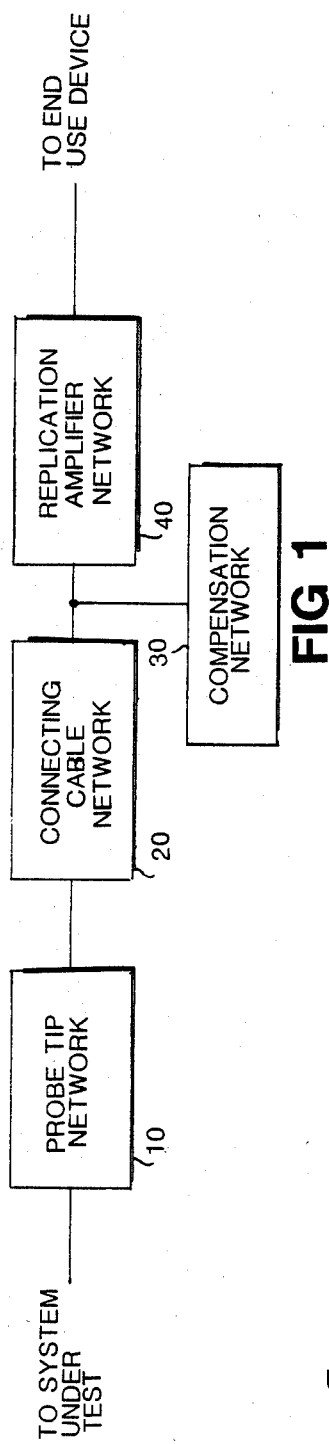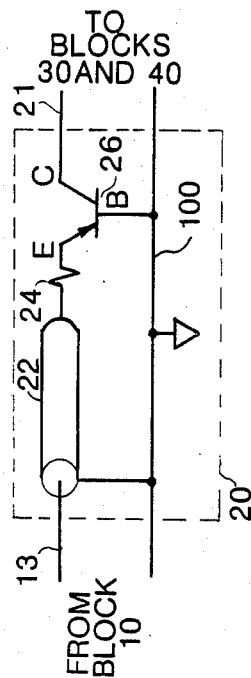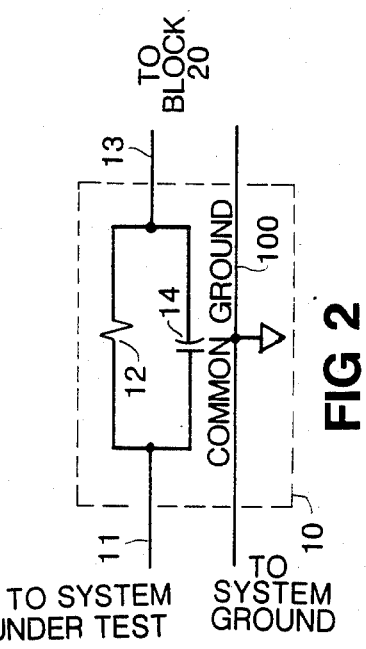

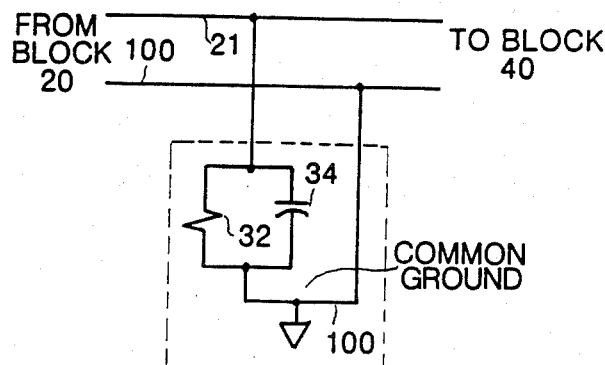
FIG 4
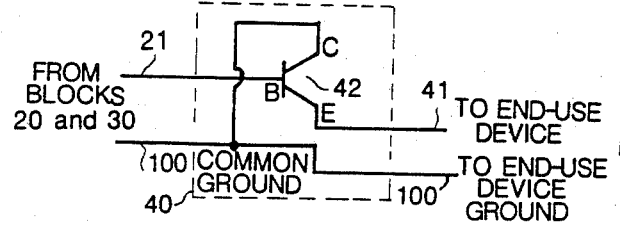
FIG 5
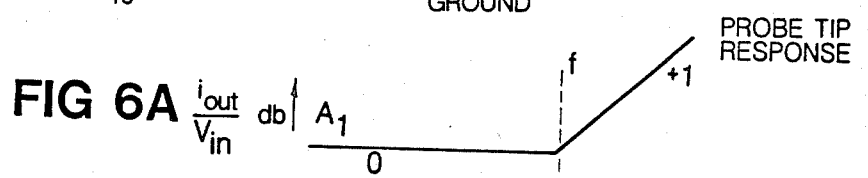
FIG 6A $\frac{i_{out}}{V_{in}}$ db  PROBE TIP RESPONSE
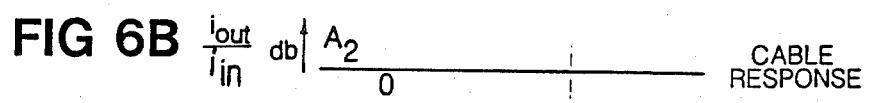
FIG 6B $\frac{i_{out}}{i_{in}}$ db  CABLE RESPONSE
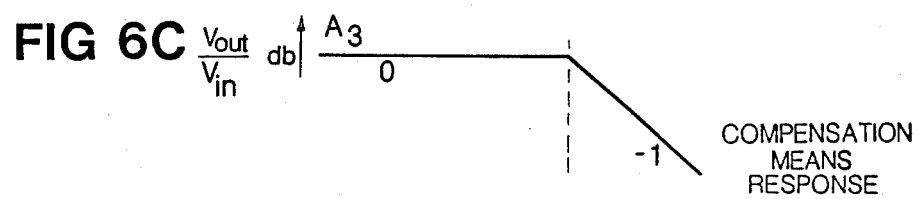
FIG 6C $\frac{V_{out}}{V_{in}}$ db  COMPENSATION MEANS RESPONSE
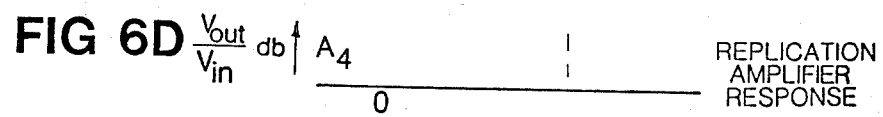
FIG 6D $\frac{V_{out}}{V_{in}}$ db  REPLICATION AMPLIFIER RESPONSE
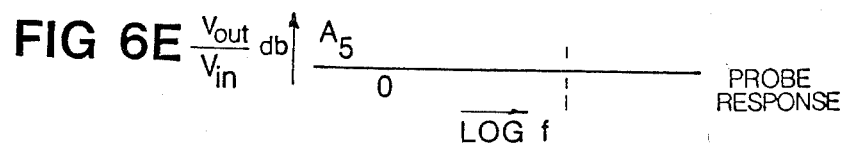
FIG 6E $\frac{V_{out}}{V_{in}}$ db  PROBE RESPONSE
LOG f

WIDE BANDWIDTH PROBE USING POLE-ZERO CANCELLATION

CROSS REFERENCE TO RELATED APPLICATION

This application is a continuation of application Ser. No. 648,901, filed Sept. 7, 1984, now abandoned.

BACKGROUND OF THE INVENTION

This invention is concerned generally with probes, and more specifically with probes for detecting and replicating high speed electronic signals with minimum disturbance of signal and maximum fidelity of replication, commonly used with devices for analyzing the detected signals, including, for example, oscilloscopes.

The usefulness of a probe depends upon the range of frequencies for which the response is true to the detected signal, the accuracy of replication, and the extent to which the probe detects the signal without detrimentally affecting the operation of the system or circuit being probed. If the input resistance of the combined probe and end-use device is the same order of magnitude as that of the circuit or system being probed, it may cause errors in the replication of the signal or a change in the operation of the circuit or system resulting in erroneous output or circuit malfunction. High probe tip capacitance will also cause circuit loading problems at higher frequencies. Designing the probe to have low capacitance and an input impedance which is very high relative to the impedance of the circuit being probed at the point of probing has been the common protection against these errors. This high impedance caused very little current to flow through the probe, allowing the circuit to operate relatively undisturbed.

The frequency response of a probe is dependent upon the capacitance of the probe in parallel with the source resistance of the circuit under test. The capacitive reactance varies as a function of frequency causing the impedance of the probe to vary with frequency. This has limited the effective bandwidth of prior art available probes, because the impedance of the probes falls at high frequencies. Minimizing the capacitance of the probe tip has been one solution for increasing the useful bandwidth of the probe. However, the probe tip capacitance has been proportional to the probe cable length, making tip capacitance difficult to erase. Compensating for the capacitance by using active electronics at the probe tip has been a second alternative which has been used for extending the effective bandwidth of the probe tip. This generally has caused the probe tip to be bulky and easily damaged.

Typical probes available in the prior art included high resistance probes which minimized resistive loading and had high input impedance at dc, but the impedance fell off rapidly with increasing frequency due to high input capacitance. High impedance cable was used with these probes to minimize capacitance, but this cable was very lossy at high frequencies, limiting bandwidth. These probes also required the measuring instrument to have a high impedance.

Also available were passive divider probes which had the lowest input capacitances available in a probe and therefore had a very broad bandwidth. However, the low input impedance could cause problems with resistive loading which could force the circuit under test into saturation, nonlinear operation, or to stop operating completely.

A third type of probes were active field effect transistor probes which had active electronics at the probe tip to compensate for loading problems due to low input impedance. These probes had a higher input impedance than the resistive divider probes and a lower capacitance than the high impedance probes, but were limited in bandwidth by the available field effect transistors, and were bulky and easily damaged.

In other fields, a concept called pole-zero cancellation has been known. One application in which the concept was used was in a system for measuring heart rate disclosed in U.S. Pat. No. 4,260,951 of Lanny L. Lewyn. In that system, pole-zero cancellation was used to cancel the long differentiation time constant so as to remove undesired shaping of the heart pressure wave caused by the second order feedback loop. This allowed the waveform to be refined so that it could enable greater accuracy in measuring the heart rate.

BRIEF SUMMARY OF INVENTION

The invention is generally to be used in probing devices of an electrical nature, with a preferred embodiment being used as a probe for an oscilloscope. The invention uses an application of the concept of pole-zero cancellation to improve the frequency response of the probe, and the concept of active termination of the coaxial cable in its characteristic impedance to provide a constant gain for the probe cable, independent of the length of the probe cable.

In one embodiment, the probe consists of four specific parts which in conjunction will detect an electronic signal in a system or circuit under test, and transmit that signal to an end-use device for analysis without significantly disturbing the original signal from the system under test. These four parts are the probe tip network, the connecting cable, the compensation network, and the replication amplifier.

In the preferred embodiment, the probe tip network may be a parallel combination of a resistor $R_t$ and a capacitor $C_t$ used for detecting the signals in the system under test. The combination causes a transmission zero in the frequency response of the probe tip network, resulting in the gain being constant from dc to a predetermined frequency and then rising at a rate of approximately 20 dB/decade.

The connecting cable may be a coaxial cable with a low characteristic impedance in comparison with the impedance of the probe tip network. The cable may be connected to the probe tip network at one end and may be terminated in its characteristic impedance at the other end by placing a resistor $R_e$ in series with the cable and the emitter of transistor $Q_1$, $Q_1$ being in a common base configuration. The resistor $R_e$ may be chosen such that is series with the emitter-to-base resistance $r_e$ of the transistor $Q_1$, the total resistance $(R_e+r_e)$ is equal to the characteristic impedance of the coaxial cable. This causes the gain of the cable to be constant with respect to frequency. Since the base current $i_b$ of transistor $Q_1$ is negligible, the current $i_e$ entering the emitter of transistor $Q_1$ is approximately equal to the current $i_c$ leaving the collector of transistor $Q_1$. Therefore the current remains unchanged.

The compensation network may be a parallel combination of a resistor $R_a$ and a capacitor $C_a$, the combination connected at one end to the collector of transistor $Q_1$ and connected to a common ground at the other end.

The combination causes a transmission pole in the frequency response of the compensation network, resulting in the gain to be constant from dc to a predetermined frequency and then fall at a rate of approximately 20 dB/decade. The resistor $R_a$ and capacitor $C_a$ are chosen such that the transmission pole in the compensation network and the transmission zero in the probe tip network occur at the same frequency. The pole and zero then effectively cancel each other out, ideally leaving the gain of the entire probe constant with respect to frequency.

The replication amplifier may be transistor $Q_2$ with the collector connected to the common ground, the base connected to the collector of transistor $Q_1$, and the emitter connected to the end-use device. This common-collector, or emitter follower configuration is used to replicate the detected signal.

The common ground runs through the entire probe and is connectable to the circuit under test and will be connected to the common ground of the analyzing device. The outer sheath of the coaxial cable will also be connected to the common ground.

The overall result is a probe which can have a high input impedance enabling the probe to detect an electronic signal in a system under test without disturbing it and be responsive over a wider range of frequencies than most available prior art probes.

DESCRIPTION OF THE FIGURES

FIG. 1 is a block diagram of a probe according to the invention, specifically a probe for an oscilloscope.

FIG. 2 is a schematic diagram of a probe tip network.

FIG. 3 is a schematic diagram of a connecting cable network.

FIG. 4 is a schematic diagram of a compensation network.

FIG. 5 is a schematic description of a replication amplifier network.

FIG. 6 is a graph of the ideal frequency response of relevant sections and the ideal frequency response of the entire probe for one embodiment.

DESCRIPTION OF THE PREFERRED EMBODIMENT

Figure 8:
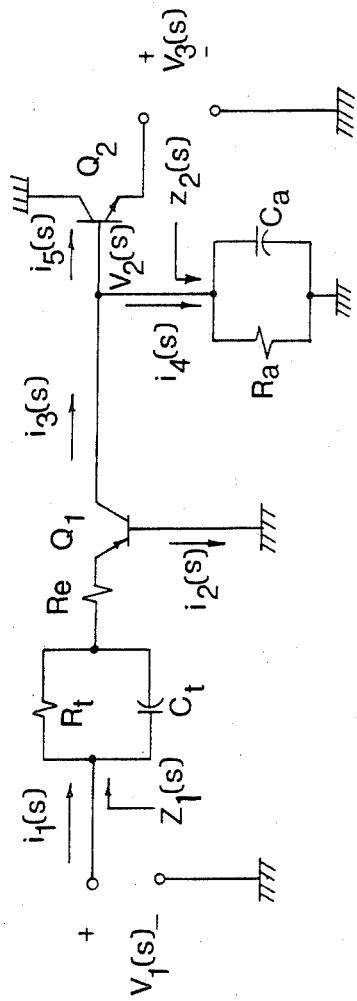
FIG. 8 is a schematic of how a circuit according to the invention appears for purposes of signal analysis.

A preferred embodiment of the invention is shown in a general block diagram form in FIG. 1, defining four blocks with different functions. Reference numbers for the blocks as shown in FIG. 1 are also used in the remaining figures where appropriate, to illustrate the relationships among the various circuit elements. Block 10 is a probe tip network which detects a signal in a system under test. Block 20 is the connecting cable network, connected to the probe tip network at one end. At the other end, the connecting cable network is connected to block 30, the compensation network, and block 40, the replication amplifier network. The connecting cable network transfers the signal produced by the probe tip network. The compensation network modifies the frequency response to compensate for the transfer function of the probe tip network. The replication amplifier network reproduces the detected signal for the end-use device.

The probe tip network, block 10, may be constructed as represented in FIG. 2 with a parallel combination of a resistor $R_t$, element 12, and a capacitor $C_t$, element 14. The combination is placed in series between the probe tip, element 11, and the connection leading to block 20, line 13. A common ground, line 100, runs through the probe tip network from the system under test to block 20.

A preferred form of connecting cable network, block 20, is represented in FIG. 3 as a coaxial cable, element 22, connecting line 13 to a resistor $R_e$, element 24. The outer sheath of the coaxial cable is connected to the common ground, line 100, entering block 20 from block 10 and continuing on to block 30 and block 40. The resistor $R_e$ is connected to the emitter of a common-base configured bipolar junction transistor $Q_1$, element 26. The base of the transistor $Q_1$ is connected to the common ground, line 100, and the collector of transistor $Q_1$, is connected to line 21, the output line for block 20.

The compensation network, block 30, may be implemented as represented in FIG. 4 by a parallel combination of a resistor $R_a$, element 32, and a capacitor $C_a$, element 34, connected to line 21 on one side of the combination and to the common ground, line 100, on the other side of the combination.

The replication amplifier network of block 40, may be realized as represented in FIG. 5 by a common-collector configured bipolar junction transistor $Q_2$, element 42. The base of transistor $Q_2$ is connected to line 21, the collector of transistor $Q_2$ is connected to the common ground, line 100, and the emitter of transistor $Q_2$ is connected to line 41, the output line for block 40. Line 41 and line 100 are connectable to the end use device after leaving block 40.

Low capacitance and high impedance at the probe tip are highly important to prevent loading the circuit under test and causing it to malfunction. The resistive element of the impedance is constant for all frequencies, while the reactive element will vary with frequency. Capacitance causes the impedance to drop as the frequency of the measured signal increases, therefore minimizing capacitance is important for retaining high impedance and minimizing signal disturbances. Minimizing capacitance will also improve the performance of a probe with respect to rise time measurements and phase shift measurements, and will be a major factor in increasing the bandwidth.

A circuit illustrating the operation of the preferred embodiment is shown in FIG. 8, to add clarity to the signal analysis discussion which follows. The coaxial cable, element 22 of FIG. 3, has been replaced in FIG. 8 by its electronic equivalance when terminated in its characteristic impedance. The rest of the circuit shown in FIG. 8 conforms to the circuit elements described earlier and shown in FIGS. 1, 2, 3, 4, and 5.

A voltage $v_1(s)$ applied at the probe tip will produce a current $i_1(s)$ entering the probe tip network. The input impedance of the probe seen at the probe tip will be:

$$z_1(s) = \frac{R_t(1/sC_t)}{(1/sC_t) + R_t} + R_e + r_e \bigg|_{s=j\omega} \quad \text{(EQ 1)}$$

$$z_1(s) = \frac{R_t}{1 + sC_tR_t} + R_e + r_e \bigg|_{s=j\omega}.$$

where $\omega = 2\pi f$ and $r_e$ is the emitter resistance of $Q_1$.

The emitter resistance $r_e$ of the transistor $Q_1$ is very small. The resistance $R_e$ is chosen such that the resistance ($R_e+r_e$) will equal the characteristic impedance of the coaxial cable. A transmission line terminated in its characteristic impedance, such as this coaxial cable, will have an equivalent impedance equal to its characteristic impedance at all frequencies. A coaxial cable with low characteristic impedance is chosen to provide low losses in transmitting high frequency signals. Consequently, the resistance ($R_e+r_e$) is very small compared with the impedance of the probe tip network and is negligible. Therefore, the input impedance becomes:

$$z_1(s) \simeq \frac{R_t}{1+sC_tR_t}\bigg|_{s=j\omega}. \tag{EQ 2}$$

Assuming $z_1(s)$ is sufficiently larger than the impedance of the circuit being probed at the point of connection not to affect $v_1(s)$, then:

$$i_1(s) = \frac{v_1(s)}{z_1(s)} = v_1(s)\left(\frac{1+sC_tR_t}{R_t}\right)\bigg|_{s=j\omega}. \tag{EQ 3}$$

Using Kirchhoff's current law at the transistor $Q_1$ the current equation becomes:

$$i_1(s) = i_2(s) + i_3(s). \tag{EQ4}$$

Since the base current $i_2(s)$ of the transistor $Q_1$ is very small with respect to the collector current $i_3(s)$ of transistor Q, it may be neglected. Consequently, $$i_1(s) \simeq i_3(s). \tag{EQ5}$$

Using Kirchhoff's current law again at the node between $Q_1$ and $Q_2$, the current equation is:

$$i_3(s) = i_4(s) + i_5(s). \tag{EQ6}$$

The input resistance of the transistor $Q_2$ at the base is very high consequently forcing $i_5(s)$ to be very small relative to $i_4(s)$. Assuming $i_5(s)$ to be negligible, then:

$$i_3(s) \simeq i_4(s) \tag{EQ7}$$

and $$i_1(s) = i_4(s). \tag{EQ8}$$

The voltage at the node between $Q_1$ and $Q_2$ is now:

$$v_2(s) = i_4(s)z_2(s) \text{ where} \tag{EQ9}$$

$$z_2(s) = \frac{R_a(1/sC_a)}{R_a + (1/sC_a)}\bigg|_{s=j\omega} = \frac{R_a}{1+sR_aC_a}\bigg|_{s=j\omega}. \tag{EQ 10}$$

Therefore:

$$v_2(s) = i_4(s)\left(\frac{R_a}{1+sR_aC_a}\right)\bigg|_{s=j\omega} \tag{EQ 11}$$

and $$v_2(s) = i_1(s)\left(\frac{R_a}{1+sR_aC_a}\right)\bigg|_{s=j\omega}. \tag{EQ 12}$$

Since the base-to-emitter voltage drop is very small, the voltage gain of transistor $Q_2$ from base to emitter is approximately unity. Therefore:

$$v_3(s) \simeq v_2(s) \text{ and} \tag{EQ13}$$

$$v_3(s) = i_1(s)\left(\frac{R_a}{1+sR_aC_a}\right)\bigg|_{s=j\omega}. \tag{EQ 14}$$

Since:

$$i_1(s) = v_1(s)\left(\frac{1+sC_tR_t}{R_t}\right)\bigg|_{s=j\omega} \tag{EQ 15}$$

then $$v_3(s) = v_1(s)\left(\frac{1+sC_tR_t}{R_t}\right)\left(\frac{R_a}{1+sR_aC_a}\right)\bigg|_{s=j\omega}. \tag{Eq 16}$$

The voltage gain of the probe then becomes:

$$\frac{v_3(s)}{v_1(s)} = \frac{(R_a)}{(R_t)}\frac{(1+sC_tR_t)}{(1+sC_aR_a)}\bigg|_{s=j\omega}. \tag{EQ 17}$$

If ($C_aR_a$) is chosen to equal ($C_tR_t$), then the voltage gain becomes:

$$\frac{v_3(s)}{v_1(s)} = \frac{R_a}{R_t}. \tag{EQ 18}$$

and is constant with respect to frequency. It is assumed that $C_a$ includes the parasitic capacitances of $Q_1$ and $Q_2$ and that the value of $R_a$ can be modified slightly to make up for the slight losses of the transistors.

FIG. 6 shows the frequency response of a probe according to the invention due to each specific section of the probe. The probe tip network has a voltage input and a current output, therefore the transfer function of output divided by input would be:

$$\frac{i_1(s)}{v_1(s)} = \left(\frac{1+sC_tR_t}{R_t}\right)\bigg|_{s=j\omega}. \tag{EQ 19}$$

The numerator of the transfer function is a transmission zero with a 3-dB frequency occurring at ($sC_tR_t=1$). The response of the probe tip network will then be:

$$\frac{i_1(s)}{v_1(s)} = \begin{pmatrix} \frac{1}{R_t}, & sC_tR_t \ll 1 \\ sC_t, & sC_tR_t \gg 1 \end{pmatrix}\bigg|_{s=j\omega}. \tag{EQ 20}$$

Placing this response on a Bode diagram yields the graph shown in FIG. 6(a). From dc to ($sC_tR_t=1$), the gain is a constant ($1/R_t$). From ($sC_tR_t=1$) to infinity, the gain rises at a constant rate of 20 dB/decade. The constant $A_1$ is therefore equal to ($1/R_t$) at dc.

The connecting cable network is a coaxial cable terminated in its characteristic impedance. This has a low characteristic impedance for low losses at high frequencies. The transfer function of output over input shows:

$$\frac{i_3(s)}{i_1(s)} = 1,$$

since $$i_3(s) = i_1(s). \quad \text{(EQ21)}$$

Therefore the gain is the constant $A_2$, which equals one, and is shown in FIG. 6(b).

The compensation network has an input of $i_4(s)$ and an output of $v_2(s)$. The transfer function for the compensating network is therefore:

$$\frac{v_2(s)}{i_4(s)} = \left(\frac{R_a}{1 + sR_aC_a}\right)\bigg|_{s=j\omega}. \quad \text{(EQ 22)}$$

The denominator of the transfer function is a transmission pole with a 3-dB frequency occuring at $(sC_aR_a=1)$. The response of the compensation network is then:

$$\frac{v_2(s)}{i_4(s)} = \left(\begin{matrix} R_a, & sR_aC_a \ll 1 \\ \frac{1}{sC_a}, & sR_aC_a \gg 1 \end{matrix}\right)\bigg|_{s=j\omega} \quad \text{(EQ 23)}$$

The straight line magnitude approximation is shown on the Bode plot in FIG. 6(c). From dc to $(sC_aR_a=1)$, the gain $A_3$ is a constant $(R_a)$ at dc. From $(sC_aR_a=1)$ to infinity the gain falls at a constant 20 dB/decade.

The input for the replication amplifier network is $v_2(s)$ and the output is $v_3(s)$. The transfer function of output over input yields:

$$\frac{v_3(s)}{v_2(s)} = 1, \text{ since}$$

$$v_3(s) = v_2(s). \quad \text{(EQ24)}$$

Therefore the gain is the constant $A_4$ which equals one, and is shown in FIG. 6(d).

The resistances and capacitances are chosen such that $(R_tC_t=R_aC_a)$ and therefore $(1+sC_aR_a=1+sC_tR_t)$, and the transmission pole and transmission zero cancel each other out. The gain $A_5$ from dc to $(sC_aR_a=1)$ is therefore:

$$A_5 = A_1A_2A_3A_4 \text{ and} \quad \text{(EQ25)}$$

$$A_5 = \left(\frac{1}{R_t}\right)(1)(R_a)(1) + \frac{R_a}{R_t}. \quad \text{(EQ 26)}$$

The gain $A_5$ from $(sC_aR_a=1)$ to infinity becomes:

$$A_5 = A_1A_2A_3A_4 \text{ and}$$

$$A_5 = (sC_t)(1)\left(\frac{1}{sC_a}\right)(1) = \frac{sC_t}{sC_a} = \frac{C_t}{C_a}. \quad \text{(EQ 27)}$$

Since $(C_aR_a=C_tR_t)$, then $(C_t/C_a=R_a/R_t)$ and the gain for the probe is constant with respect to frequency.

The invention allows a probe to be designed with a low capacitance, high impedance probe tip which is small and durable. It may be used with a cable of any length but will still provide low losses at high frequencies. The probe will also perform predictably over a wider bandwidth than currently available similar probes.

Figure 7:
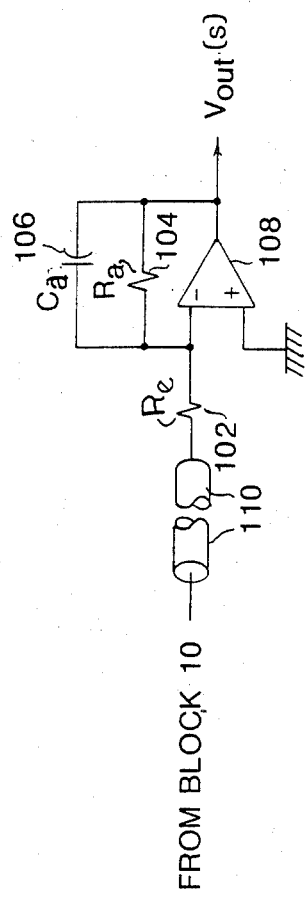
FIG. 7 is a schematic showing an alternate embodiment of the invention.

Specific circuitry for an embodiment of the invention is illustrated in detail in the schematics of FIG. 7, FIG. 8 and FIG. 9. FIG. 8 and FIG. 9 together form the schematic for a thick film microcircuit U1 shown in FIG. 7. The input from the probe tip, which may be a resistor and capacitor in parallel built using thick film technology, is passed through a coaxial cable and enters the circuit in FIG. 7 at point A. It enters the microcircuit at pin 18 and the output leaves the microcircuit at pin 9 and becomes output to the scope at point B.

In FIG. 8, the input enters the circuit at pin 18. The resistor, element 82, in FIG. 8 is the main contributor to the resistor $R_e$, previously discussed as element 24 in FIG. 3, and element $R_e$ in FIG. 11. The transistor $Q_1$, corresponding to element 26 of FIG. 3 and transistor $Q_1$ of FIG. 11, is represented by two cascaded transistors in FIG. 8, which are labeled elements 84 and 86.

The line from the circuit in FIG. 8 to the circuit in FIG. 9, line 81, is shown in FIG. 3 as line 21, and in FIG. 11 as the line through which $i_e(s)$ travels. The resistor $R_a$ in FIG. 11, element 32 in FIG. 4, has as its principal components element 92 in FIG. 9 and element 72 in FIG. 7. The capacitor $C_a$ in FIG. 11, element 34 in FIG. 4, has as a main contribution a parasitic capacitance due to the traces on the hybrid at the base of the transistor, element 96 shown in FIG. 9, which is not shown. Also contributing to the capacitance $C_a$ are elements 94 in FIG. 9 and element 74 in FIG. 7. The transistor $Q_2$ in FIG. 11, element 42 in FIG. 5, is represented by two cascaded transistors, element 96 in FIG. 9 and element 98 in FIG. 9. The output from the emitter of element 98 then goes to pin 9 of the microcircuit shown in FIG. 9 and FIG. 7, and becomes point B in FIG. 7, the output to the ocsilloscope.

The following approximate values have been found to yield desirable results: $R_t=10$ K$\Omega$, $C_t=0.5$ pF, $R_a=1$ K$\Omega$, $C_a=5$ pF. Using these values and a circuit topology realized with microwave transistors and thick film technology a probe was produced having a total tip capacitance of about 2 pF (the excess above 0.5 pF being caused by the physical structure required to hold the probe tip), an attenuation ratio of 10:1 and a bandwidth of about 1.5 GHz.

The advantages of this embodiment of the invention include the low capacitance of the probe tip. This tends not to cause loading problems on the circuit under test even at high frequencies. The high impedance of the tip also aids with respect to resistive loading. The low capacitance provides a wide bandwidth for the probe. The probe may be built with small, durable probe tip and may use cables of varying lengths without problems.

One potential problem with similar embodiments can be noise. If $R_t$ were increased to 1M $\Omega$ instead of 10 K$\Omega$, the signal available at low frequencies is reduced by a factor of 100 requiring one hundred times more gain from the probe. The basic input noise of the amplifier cannot be reduced by a factor of 100; therefore, the output signal to noise ratio would be degraded significantly.

An alternate embodiment is shown in FIG. 7. This circuit would replace block 20, block 30, and block 40 of FIG. 1. The coaxial cable, element 110, would be the same as the coaxial cable, element 22 in FIG. 3. A resistor $R_e$, element 102 would be connected in series between the coaxial and the inverting input terminal of an operational amplifier, element 108. The noninverting input terminal of the operational amplifier would be connected to the common ground, line 100. Connected between the inverting input terminal and the output terminal of the operational amplifier, element 108, is the parallel combination of a resistor $R_a$, element 104, and a capacitor $C_a$, element 106. The output terminal of the operational amplifier, element 108, is connected to the end use device.

In this embodiment, the bandwidth of the circuit will be limited because of the use of feedback, and because the input resistance is dependent on open loop gain, making it more difficult to control. The contributors of noise are fewer and of lesser magnitude than those of the embodiment described above. The bandwidth of the circuit will depend on the gain bandwidth product of the operational amplifier.

The feedback loop of the resistance $R_a$ in parallel with the capacitance $C_a$ provides the transmission pole to cancel the transmission zero of the probe tip network. The coaxial cable is terminated in its characteristic impedance, the majority of that load coming from the resistance $R_e$. The gain of this circuit is also $(R_a/R_t)$ when $(R_aC_a=R_tC_t)$.

Other possible variations in the specific embodiments disclosed include using field effect transistors instead of bipolar junction transistors. This, however, may limit the bandwidth achieved.

In each of these embodiments the ideal response fails at some point because of the inherent physical characteristics of the materials and elements used to build each circuit. The causes of this failure of the ideal response are myriad, and are beyond the scope of this discussion.

I claim:

1. A probe apparatus for detecting first electronic signals in a system under test and replicating said first signals for an end use device, comprising:
    detection means for detecting said first electronic signals and producing second electronic signals in response to said first signals, said detection means having a transmission zero in the frequency response at a preselected frequency;
    compensation means, having a first end and a second end, said first end of compensation means connected to ground, for compensation of said transmission zero of said detection means, said compensation means having a transmission pole in the frequency response at a frequency substantially equal to said preselected frequency;
    replication means, having a first end, a second end, and a third end, connectable to said end use device at said first end of replication means, said second end of replication means connected to ground, for replicating said first electronic signals in response to said second electronic signals for use in said end use device; and
    cable means, having a first end, a second end, and a third end, connected to said detection means at said first end of cable means and connected to said second end of compensation means and said third end of replication means at said second end of cable means and connected to ground at said third end of cable means, for transferring said second electronic signals from said detection means to said replication means and said compensation means, wherein said cable means comprises a transfer means, having a characteristic impedance, for transferring said second electronics signals within said cable means and a termination means for terminating said transfer means in said characteristic impedance of said transfer means and for transferring said second electronic signals from said transfer means to said replication means and said compensation means.

2. A probe apparatus for detecting and replicating electronic signals as recited in claim 1, wherein said detection means comprises a probe tip network having a first resistor and a first capacitor connected in parallel, said probe tip network being connected in series from a probe tip to said first end of said cable means.

3. A probe apparatus for detecting and replicating electronic signals as recited in claim 2, wherein said first resistor and said first capacitor are manufactured using thick film technology.

4. A probe apparatus for detecting and replicating electronic signals as recited in claim 1, wherein said compensation means comprises a compensation network having a resistor and a capacitor connected in parallel, said compensation network being connected in series from said second end of said cable means to a common ground.

5. A probe apparatus for detecting and replicating electronic signals as recited in claim 1, wherein said replication means comprises a first transistor having a first base, a first emitter, and a first collector.

6. A probe apparatus for detecting and replicating electronic signals as recited in claim 5, wherein said first base is connected to said cable means, said first collector is connected to a common ground, and said first emitter is connectable to said end use device.

7. A probe apparatus for detecting and replicating electronic signals as recited in claim 1, wherein said termination means comprises a third resistor and a second transistor, having a second base, a second collector, and a second emitter.

8. A probe apparatus for detecting and replicating electronic signals as recited in claim 7, wherein said third resistor is connected in series between said transfer means and said second emitter, said second base is connected to a common ground, and said second collector is connected to said compensation means and said replication means.

9. A probe apparatus for detecting and replicating electronic signals as recited in claim 1, wherein said transfer means comprises a coaxial cable.

10. A probe apparatus for detecting and replicating electronic signals as recited in claim 7, wherein said transfer means comprises a coaxial cable.

11. A probe apparatus for detecting and replicating electronic signals as recited in claim 8, wherein said transfer means comprises a coaxial cable.

12. A probe apparatus for detecting and replicating electronic signals as recited in claim 1, wherein:
    said detection means comprises a probe tip network having a first resistor and a first capacitor connected in parallel, said probe tip network connected in series between a probe tip and said first end of said cable means;
    said first resistor and said first capacitor are manufactured using thick film technology;
    said compensation means comprises a compensation network having a second resistor and a second capacitor connected in parallel, said compensation network being connected in series from said second end of said cable means to a common ground;

said replication means comprises a first transistor having a first base, a first collector, and a first emitter, said first base is connected to said cable means, said first collector is connected to said common ground, and said first emitter is connected to said end use device;

said transfer means comprises a coaxial cable; and said termination means comprises a third resistor and a second transistor, having a second base, a second collector, and a second emitter, wherein said third resistor is connected in series between said transfer means and said second emitter, said second base is connected to said common ground, and said second collector is connected to one end of said compensaton network not connected to ground and said first base of said first transistor of said replication means.

* * * * *